(12) United States Patent
Choi et al.

(10) Patent No.: US 11,404,655 B2
(45) Date of Patent: Aug. 2, 2022

(54) DISPLAY DEVICE

(71) Applicant: Samsung Display Co., Ltd., Yongin-si (KR)

(72) Inventors: Sungchul Choi, Hwaseong-si (KR); Hansun Ryou, Seoul (KR); Mansik Myeong, Seoul (KR); Jaiku Shin, Hwaseong-si (KR); Jihwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/359,681

(22) Filed: Mar. 20, 2019

(65) Prior Publication Data

US 2019/0305236 A1    Oct. 3, 2019

(30) Foreign Application Priority Data

Mar. 30, 2018    (KR) .................. 10-2018-0037440

(51) Int. Cl.
   *H01L 51/00*    (2006.01)
   *H01L 27/32*    (2006.01)
   (Continued)

(52) U.S. Cl.
   CPC ............ *H01L 51/0097* (2013.01); *B32B 7/12* (2013.01); *H01L 27/3246* (2013.01);
   (Continued)

(58) Field of Classification Search
   CPC ............ H01L 51/0097; H01L 51/5281; H01L 51/5253; H01L 51/5237; H01L 51/5293;
   (Continued)

(56) References Cited

U.S. PATENT DOCUMENTS 8,194,399 B2    6/2012 Ashcraft et al.
9,231,640 B2    1/2016 Yoon et al.
(Continued)

FOREIGN PATENT DOCUMENTS

CN    103582339 A    2/2014
CN    103685627 A    3/2014
(Continued)

OTHER PUBLICATIONS

EPO Extended European Search Report dated Apr. 12, 2019, corresponding to European Patent Application No. 18197549.1, 9 pages.

(Continued)

*Primary Examiner* — Eli D. Strah
(74) *Attorney, Agent, or Firm* — Lewis Roca Rothgerber Christie LLP

(57) ABSTRACT

A display device includes a flexible display panel, a plurality of functional layers above the flexible display panel, and a plurality of adhesive members each being between respective ones of the functional layers or between one functional layer among the functional layers and the flexible display panel. A sum of thicknesses of the adhesive members is equal to or greater than about 135 micrometers ($\mu$m) and equal to or less than about 200 micrometers ($\mu$m), and the thickness of the adhesive member having the largest thickness among the adhesive members is equal to or less than about 1.3 times the thickness of the adhesive member having the smallest thickness among the adhesive members.

13 Claims, 11 Drawing Sheets

(51) Int. Cl.
*H01L 51/52* (2006.01)
*B32B 7/12* (2006.01)
*H01L 27/12* (2006.01)
*H01L 29/786* (2006.01)
*B32B 7/14* (2006.01)
*B32B 5/14* (2006.01)

(52) U.S. Cl.
CPC ...... *H01L 51/5253* (2013.01); *H01L 51/5281* (2013.01); *B32B 5/145* (2013.01); *B32B 7/14* (2013.01); *B32B 2307/42* (2013.01); *B32B 2307/54* (2013.01); *B32B 2307/732* (2013.01); *B32B 2457/206* (2013.01); *H01L 27/1251* (2013.01); *H01L 27/323* (2013.01); *H01L 29/78645* (2013.01); *H01L 2251/5338* (2013.01); *H01L 2251/558* (2013.01)

(58) Field of Classification Search
CPC ............... H01L 27/3246; H01L 27/323; H01L 27/1251; H01L 27/1218; H01L 27/1255; H01L 27/32; H01L 27/3223; H01L 2251/558; H01L 2251/5338; H01L 29/78645; H01L 27/3244; B32B 7/12; B32B 7/14; B32B 5/145; B32B 2457/206; B32B 2307/732; B32B 2307/54; B32B 2307/42; B32B 2457/00; B32B 2307/546; B32B 2307/558; B32B 3/04; B32B 2250/05; Y02E 10/549; G09F 9/301; Y02P 70/50
See application file for complete search history.

(56) References Cited

U.S. PATENT DOCUMENTS

| | | | |
|---|---|---|---|
| 9,661,114 | B2 | 5/2017 | Jeong et al. |
| 9,923,172 | B2 | 3/2018 | Okumoto et al. |
| 9,983,714 | B2 | 5/2018 | Ahn |
| 10,074,701 | B2 | 9/2018 | Jeong et al. |
| 10,147,772 | B2 | 12/2018 | Breedlove et al. |
| 10,399,310 | B2 | 9/2019 | Nodono et al. |
| 10,476,013 | B2 * | 11/2019 | Shin ................. H01L 51/0097 |
| 10,732,445 | B2 * | 8/2020 | Shin ................. G06F 3/044 |
| 2006/0066803 | A1 | 3/2006 | Aylward et al. |
| 2012/0045861 | A1 | 2/2012 | Eguchi et al. |
| 2013/0034685 | A1 | 2/2013 | An et al. |
| 2013/0164478 | A1 * | 6/2013 | Yamamoto ............. B32B 27/00 428/41.8 |
| 2013/0335344 | A1 | 12/2013 | Han et al. |
| 2014/0030496 | A1 | 1/2014 | Oh et al. |
| 2014/0184053 | A1 | 7/2014 | Cho et al. |
| 2014/0226275 | A1 | 8/2014 | Ko et al. |
| 2015/0200333 | A1 | 7/2015 | Okumoto et al. |
| 2015/0200375 | A1 * | 7/2015 | Kim ................. H01L 27/3244 257/40 |
| 2015/0201487 | A1 * | 7/2015 | Kee ................. G02F 1/13338 361/749 |
| 2015/0261332 | A1 | 9/2015 | Nakamura et al. |
| 2015/0266272 | A1 | 9/2015 | Lee et al. |
| 2015/0266727 | A1 | 9/2015 | Baker et al. |
| 2015/0268697 | A1 | 9/2015 | Nam et al. |
| 2015/0310776 | A1 | 10/2015 | Lee et al. |
| 2016/0111678 | A1 * | 4/2016 | Lee ................. C09J 7/10 257/40 |
| 2017/0153668 | A1 * | 6/2017 | Jang ................. G06F 1/1641 |
| 2017/0162823 | A1 | 6/2017 | Kim et al. |
| 2017/0200915 | A1 | 7/2017 | Lee et al. |
| 2017/0278899 | A1 * | 9/2017 | Yang ................. H01L 51/0097 |
| 2017/0309867 | A1 * | 10/2017 | Mun ................. H01L 51/5253 |
| 2017/0317315 | A1 | 11/2017 | Yang et al. |
| 2017/0357289 | A1 | 12/2017 | Ahn |
| 2017/0373281 | A1 * | 12/2017 | Park ................. H01L 51/5281 |
| 2018/0033834 | A1 | 2/2018 | Jun et al. |
| 2018/0081219 | A1 | 3/2018 | Kim |
| 2018/0097197 | A1 | 4/2018 | Han et al. |
| 2018/0153054 | A1 | 5/2018 | Kim et al. |
| 2018/0370207 | A1 * | 12/2018 | Nodono ................. B32B 27/34 |
| 2019/0006444 | A1 | 1/2019 | Nishimura |
| 2019/0042042 | A1 | 2/2019 | Hei et al. |
| 2019/0044078 | A1 | 2/2019 | Chen |
| 2019/0193374 | A1 | 6/2019 | Yamasaki et al. |
| 2020/0064973 | A1 | 2/2020 | Mitsui et al. |
| 2020/0386917 | A1 | 12/2020 | Hashimoto et al. |

FOREIGN PATENT DOCUMENTS

| | | |
|---|---|---|
| CN | 104347007 A | 2/2015 |
| CN | 106847086 A | 6/2017 |
| CN | 107003774 A | 8/2017 |
| EP | 2833426 A2 | 2/2015 |
| EP | 3223122 A2 | 9/2017 |
| JP | 2011-33562 A | 2/2011 |
| JP | 2015-156371 A | 8/2015 |
| KR | 10-2013-0142405 A | 12/2013 |
| KR | 10-2014-0035620 A | 3/2014 |
| KR | 10-2015-0084260 A | 7/2015 |
| KR | 10-2015-0088101 A | 7/2015 |
| KR | 10-2015-0107621 A | 9/2015 |
| KR | 10-1579710 B1 | 12/2015 |
| KR | 10-2017-0066764 A | 6/2017 |
| KR | 10-2017-0084402 A | 7/2017 |
| KR | 10-2017-0108993 A | 9/2017 |
| KR | 10-2017-0113822 A | 10/2017 |
| KR | 10-2017-0121672 A | 11/2017 |
| WO | WO-2017014287 A1 * | 1/2017 ............. C08J 7/043 |
| WO | 2017/038913 A1 | 3/2017 |
| WO | WO-2017066364 A1 * | 4/2017 ............. B32B 27/36 |

OTHER PUBLICATIONS

Young's Modulus of materials (Engineering Toolbox) (Year: 2019).
U.S. Notice of Allowance dated Jul. 9, 2019, issued in U.S. Appl. No. 16/287,985 (9 pages).
U.S. Office Action dated Aug. 23, 2019, issued in U.S. Appl. No. 16/017,956 (22 pages).
U.S. Final Office Action dated Dec. 6, 2019, issued in U.S. Appl. No. 16/017,956 (20 pages).
U.S. Office Action dated Aug. 12, 2020, issued in U.S. Appl. No. 16/933,846 (19 pages).
U.S. Final Office Action dated Feb. 5, 2021, issued in U.S. Appl. No. 16/933,846 (23 pages).
Chinese Examination Report dated Jun. 2, 2021, issued in Chinese Patent Application No. 201811104346.0 (9 pages).
U.S. Advisory Action dated Apr. 21, 2021, issued in U.S. Appl. No. 16/933,846 (5 pages).
U.S. Advisory Action from U.S. Appl. No. 16/933,846, dated Apr. 12, 2022, 3 pages.
U.S. Office Action from U.S. Appl. No. 16/933,846, dated May 25, 2022, 16 pages.

* cited by examiner

DISPLAY DEVICE

CROSS-REFERENCE TO RELATED APPLICATION

This application claims priority to and the benefit of Korean Patent Application No. 10-2018-0037440, filed on Mar. 30, 2018, the entire content of which is incorporated herein by reference.

BACKGROUND

1. Field

Embodiments of the present disclosure relate to a flexible display device. For example, embodiments of the present disclosure relate to a display device having improved reliability.

2. Description of the Related Art

A display device is capable of displaying a variety of images through a display screen to provide a user with information. In general, the display device displays the information through the display screen allocated thereto. In recent years, flexible display devices employing a flexible display panel have been developed. Different from a rigid display device, the flexible display device is designed to be folded, rolled, or curved like a paper. The flexible display device whose shape is changed variously is portable regardless of the existing screen size, and thus a user's convenience is improved.

When implementing the flexible display device, components of the flexible display device, which are attached to each other by an adhesive member, are delaminated from each other by stress generated during the folding, rolling, or curving of the flexible display device. In addition, when an external impact is applied to the flexible display device, the flexible display panel is damaged.

SUMMARY

Embodiments of the present disclosure provide a flexible display device capable of preventing or reducing a separation phenomenon from occurring therein when the flexible display device is folded.

Embodiments of the present disclosure provide a flexible display device capable of preventing from being damaged even though an external impact is applied to the flexible display device (or reducing an amount or likelihood of damage when the flexible display device receives an external impact).

Embodiments of the present disclosure provide a display device including a flexible display panel, a plurality of functional layers above the flexible display panel, and a plurality of adhesive members each being between the functional layers or between one functional layer among the functional layers and the flexible display panel. A sum of thicknesses of the adhesive members is equal to or greater than about 135 micrometers ($\mu$m) and equal to or smaller than about 200 micrometers ($\mu$m), and the thickness of the adhesive member having a largest thickness among the adhesive members is equal to or smaller than about 1.3 times the thickness of the adhesive member having a smallest thickness among the adhesive members.

The adhesive member having the smallest thickness is above the adhesive member having the largest thickness.

Each of the functional layers includes a high molecular weight material and has a modulus equal to or greater than about 2 GPa and equal to or smaller than about 100 GPa.

The functional layers include an impact-absorbing functional layer to absorb an impact applied thereto.

The functional layers further include a polarizing functional layer to polarize a light incident thereto, and the polarizing functional layer is between the impact-absorbing functional layer and the flexible display panel.

The functional layers further include a window functional layer on the polarizing functional layer.

The functional layers further include a protection functional layer on the window functional layer.

The display device further includes a cushion layer under the flexible display panel to absorb an impact applied thereto.

The display device further includes a set member under the cushion layer to support the flexible display panel.

Each of the functional layers has a thickness equal to or greater than about 35 micrometers ($\mu$m) and equal to or smaller than about 60 micrometers ($\mu$m).

Embodiments of the present disclosure provide a display device including a flexible display panel, a set member under the flexible display panel to support the flexible display panel, and a plurality of adhesive layers on the flexible display panel. A sum of thicknesses of the adhesive layers is equal to or greater than about 135 micrometers ($\mu$m) and equal to or smaller than about 200 micrometers ($\mu$m), and a deviation in thickness between the adhesive layers is equal to or smaller than about 30%.

According to the above, the separation phenomenon may be prevented from occurring in the flexible display device when the flexible display device is folded (or a likelihood or degree of the separation phenomenon may be reduced), and the flexible display device with a high resistance to external impact applied thereto may be provided.

BRIEF DESCRIPTION OF THE DRAWINGS

The above and other features of the subject matter of the present disclosure will become readily apparent by reference to the following detailed description when considered in conjunction with the accompanying drawings wherein.

DETAILED DESCRIPTION

Figure 1:
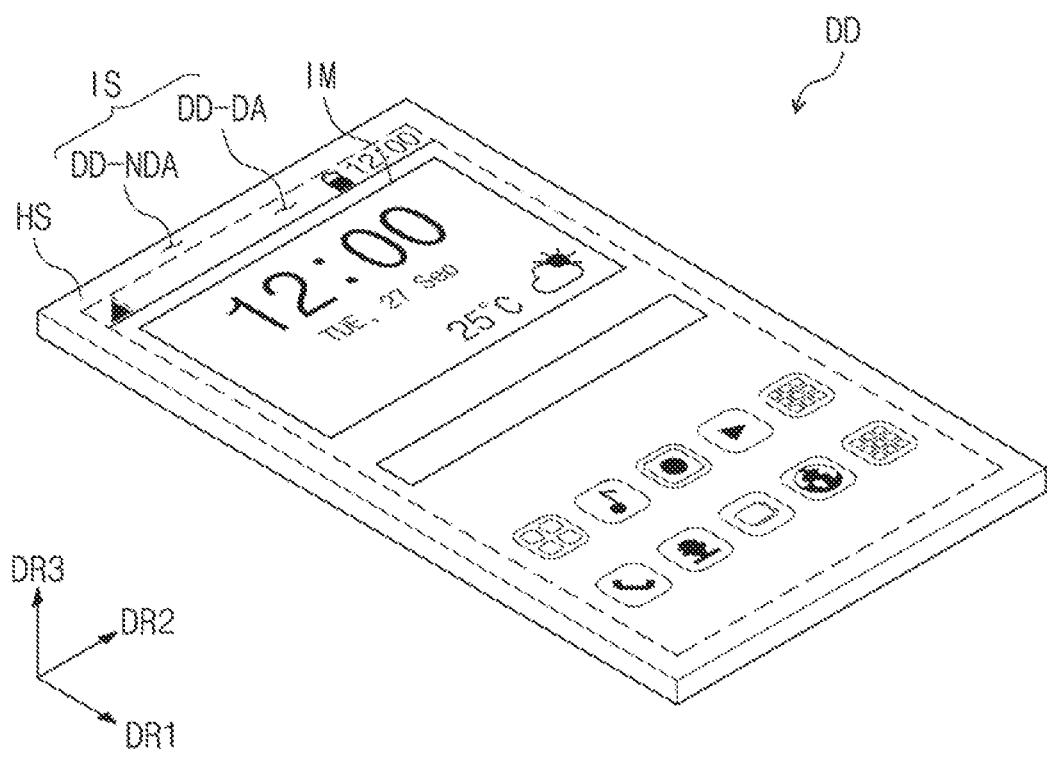
FIG. 1 is a perspective view showing a display device according to an exemplary embodiment of the present disclosure.

Hereinafter, embodiments of the present disclosure will be explained in more detail with reference to the accompanying drawings.

In the drawings, the thickness of layers, films, and regions may be exaggerated for clarity. As used herein, the term "and/or" includes any and all combinations of one or more of the associated listed items.

It will be further understood that the terms "includes" and/or "including", when used in this specification, specify the presence of stated features, integers, acts, operations, elements, and/or components, but do not preclude the presence or addition of one or more other features, integers, acts, operations, elements, components, and/or groups thereof.

FIG. 1 is a perspective view showing a display device DD according to an exemplary embodiment of the present disclosure. Referring to FIG. 1, a display surface IS on which an image IM is displayed is substantially parallel to a surface defined by a first directional axis DR1 and a second directional axis DR2. A third directional axis DR3 indicates a normal line direction of the display area DA, e.g., a thickness direction of the electronic device DD. Front (or upper) and rear (or lower) surfaces of each member of the electronic device 10 are distinguished from each other by the third directional axis DR3. However, directions indicated by the first, second, and third directional axes DR1, DR2, and DR3 may be relative to each other and changed to other directions. Hereinafter, first, second, and third directions respectively correspond to directions indicated by the first, second, and third directional axes DR1, DR2, and DR3 and are assigned with the same reference numerals as the first, second, and third directional axes DR1, DR2, and DR3.

The display device DD according to an exemplary embodiment of the present disclosure may be a foldable display device or a rollable display device, but it should not be limited thereto or thereby. The display device DD according to an exemplary embodiment of the present disclosure may be applied to a large-sized electronic item, such as a television set, a monitor, etc., and a small and medium-sized electronic item, such as a mobile phone, a tablet computer, a car navigation unit, a game unit, a smart watch, etc.

Referring to FIG. 1, the display surface IS of the display device DD may include a plurality of areas. The display device DD includes a display area DD-DA through which the image IM is displayed and a non-display area DD-NDA adjacent to the display area DD-DA. The non-display area DD-NDA does not display the image IM. FIG. 1 shows icons of applications and a clock window as a representative example of the image IM. The display area DD-DA may have a quadrangular shape. The non-display area DD-NDA may surround the display area DD-DA, however according to other embodiments, the display area DD-DA and the non-display area DD-NDA may be designed to have shapes relative to each other.

The display device DD may include a housing HS. The housing HS may be outside of the display device DD and may accommodate components therein.

FIGS. 2A-2E are perspective views showing a folding or rolling state of the display device DD shown in FIG. 1.

Figure 2A:
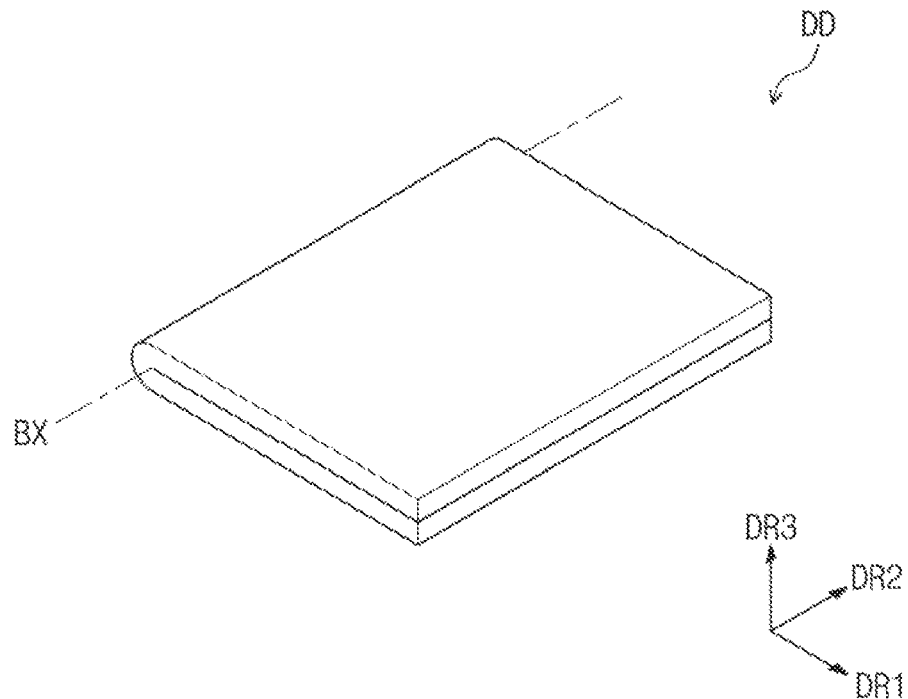
FIGS. 2A-2E are perspective views showing a folding or rolling state of the display device shown in FIG. 1.
Figure 2B:
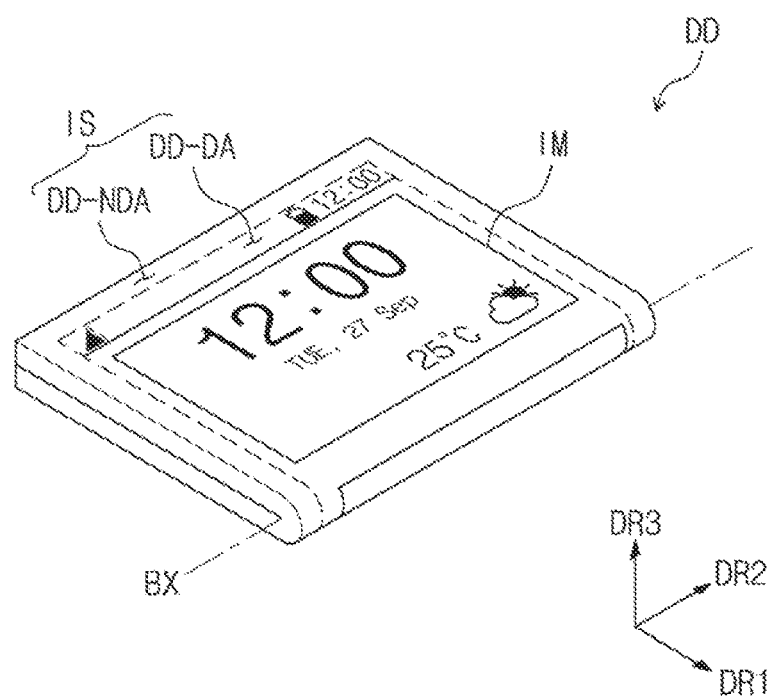
Figure 2C:
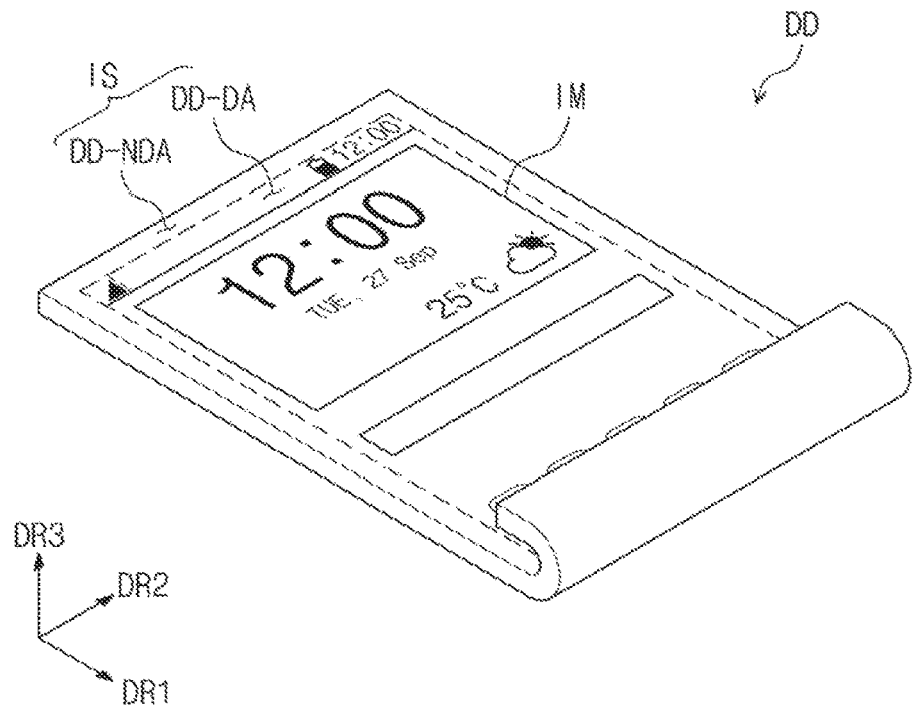
Figure 2D:
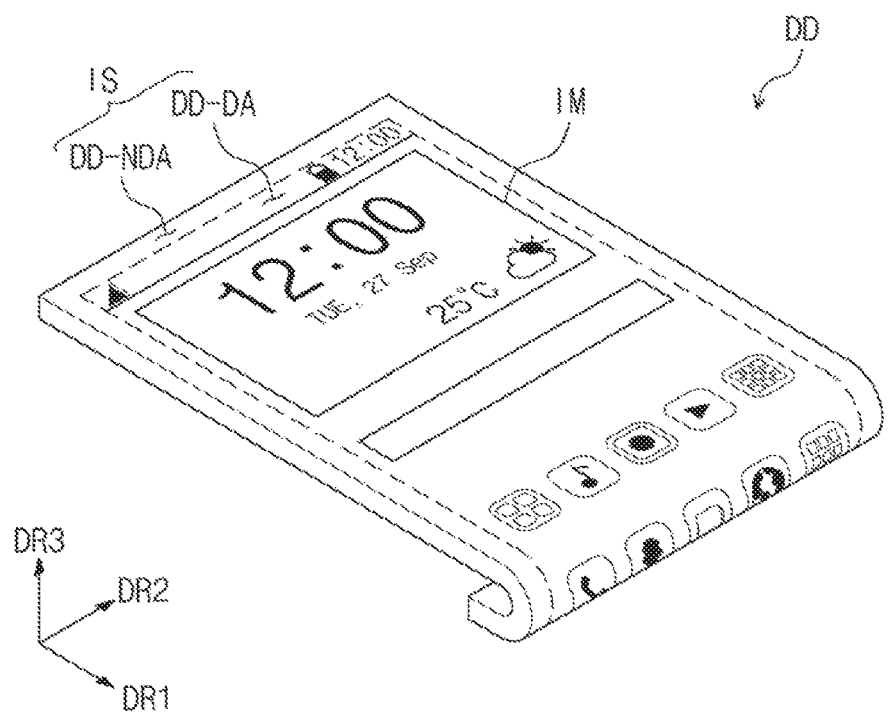
Figure 2E:
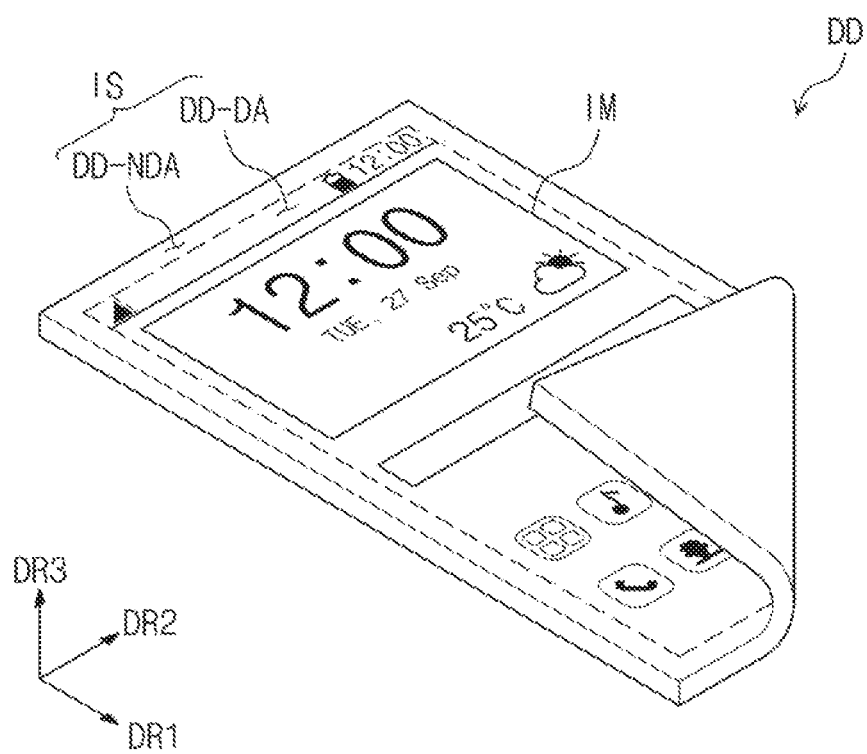

Referring to FIG. 2A, the display device DD according to an exemplary embodiment of the present disclosure may be inwardly folded (in-folding) with respect to a bending axis BX. Referring to FIG. 2B, the display device DD according to an exemplary embodiment of the present disclosure may be outwardly folded (out-folding) with respect to the bending axis BX. Referring to FIG. 2C, the display device DD according to an exemplary embodiment of the present disclosure may be rolled inwardly from an end portion to an inside portion thereof or folded. Referring to FIG. 2D, the display device DD according to an exemplary embodiment of the present disclosure may be rolled outwardly from an end portion to an outside portion thereof or folded. Referring to FIG. 2E, the display device DD according to an exemplary embodiment of the present disclosure may be diagonally folded or rolled. FIGS. 2A-2E show various suitable rolling or folding states of the display device DD, but the rolling or folding of the display device DD should not be particularly limited.

Figure 3:
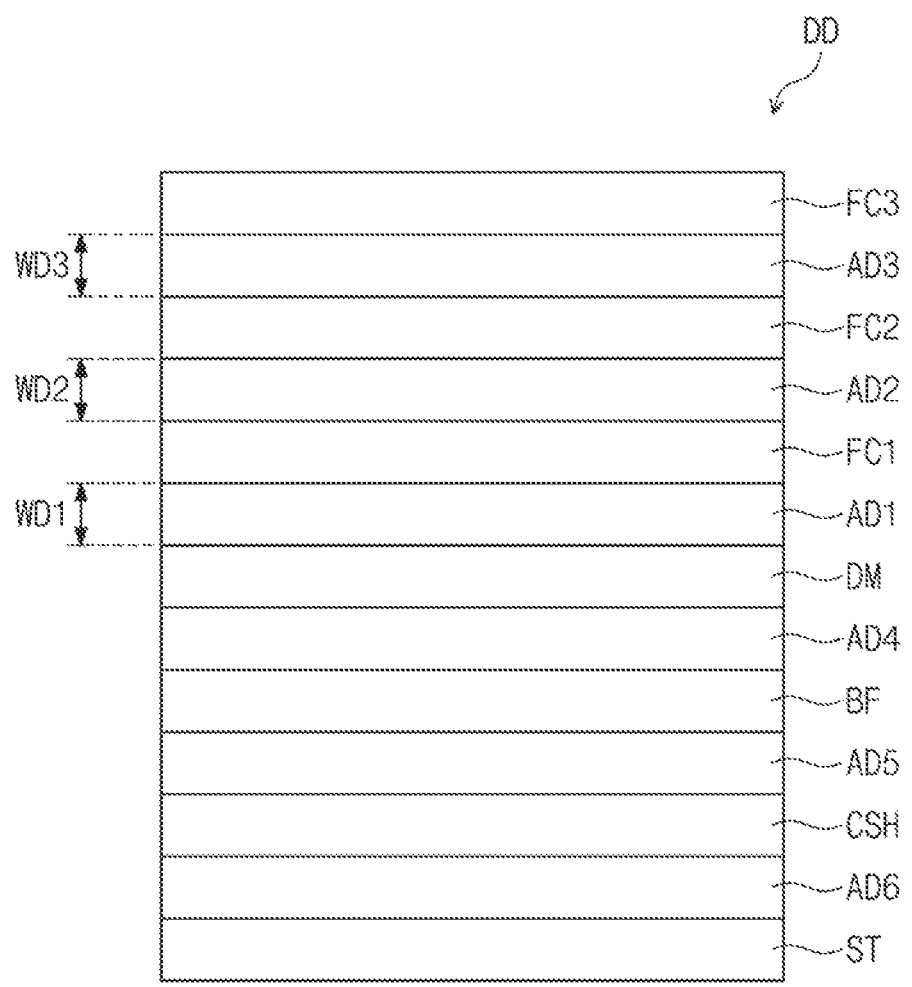
FIG. 3 is a cross-sectional view showing a display device according to an exemplary embodiment of the present disclosure.
Figure 4A:
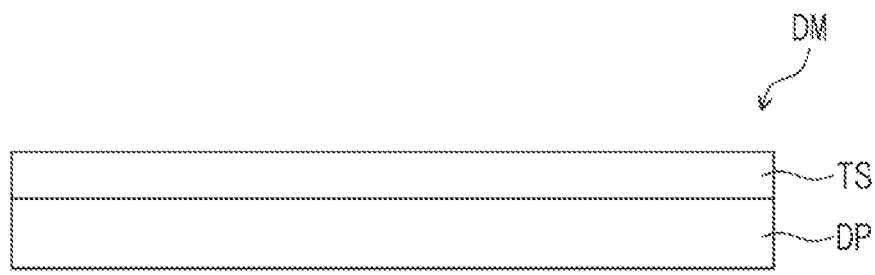
FIGS. 4A-4B are cross-sectional views showing a display module shown in FIG. 3.
Figure 4B:
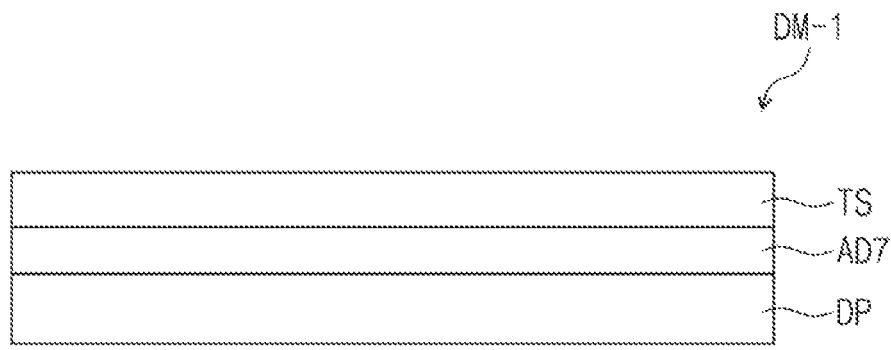

FIG. 3 is a cross-sectional view showing a display device DD according to an exemplary embodiment of the present disclosure. FIGS. 4A-4B are cross-sectional views showing a display module DM and DM-1 shown in FIG. 3. FIG. 3 shows the cross section defined by the second directional axis DR2 and the third directional axis DR3.

The display device DD includes the display module DM, a plurality of functional layers FC1, FC2, and FC3, a base film BF, a cushion layer CSH, a set member ST, and a plurality of adhesive members AD1, AD2, AD3, AD4, AD5, and AD6.

In an exemplary embodiment of the present disclosure, each of the adhesive members AD1 to AD6 may be, but not limited to, a pressure sensitive adhesive (PSA).

The functional layers FC1 to FC3 may be above the display module DM.

A first functional layer FC1 may be attached to the display module DM by a first adhesive member AD1. A second functional layer FC2 may be attached to the first functional layer FC1 by a second adhesive member AD2. A third functional layer FC3 may be attached to the second functional layer FC2 by a third adhesive member AD3.

Each of the functional layers FC1 to FC3 may include a high molecular weight material. Each of the functional layers FC1 to FC3 may have a film shape. Each of the functional layers FC1 to FC3 may have a modulus from about 2 GPa to about 100 GPa.

Each of the functional layers FC1 to FC3 may have a thickness from about 35 micrometers (μm) to about 60 micrometers (μm). When the thickness of each of the functional layers FC1 to FC3 is less than (e.g., smaller than) about 35 micrometers (μm), originally intended functions of the functional layers FC1 to FC3 are deteriorated, and when the thickness of each of the functional layers FC1 to FC3 is greater than about 60 micrometers (μm), a flexibility of the functional layers FC1 to FC3 is reduced. In an exemplary embodiment of the present disclosure, the first functional layer FC1 may be a polarizing functional layer to polarize a light incident thereto. The second functional layer FC2 may be an impact-absorbing functional layer to absorb an impact applied thereto from the outside of the second functional layer FC2. The third functional layer FC3 may be a window functional layer to form an outer surface of the display device DD.

In some embodiments, a protective function layer may be on the third functional layer FC3.

The base film BF, the cushion layer CSH, and the set member ST are under the display module DM.

The base film BF may be attached to the display module DM by a fourth adhesive member AD4. The base film BF may include a high molecular weight material.

The cushion layer CSH may be attached to the base film BF by a fifth adhesive member AD5. The cushion layer CSH may include a high molecular weight material. The cushion layer CSH may be a layer that absorbs the impact applied thereto from the outside.

The set member ST may be attached to the cushion layer CSH by a sixth adhesive member AD6. The set member ST may support the display module DM. The set member ST may include a hinge utilized or required to fold or curve the display module DM. The set member ST may correspond to a portion of the housing HS (refer to FIG. 1).

Referring to FIG. 4A, a display module DM may include a display panel DP and an input sensing unit TS. The input sensing unit TS may sense a touch and/or a pressure applied thereto from the outside.

The input sensing unit TS may be directly on a thin film encapsulation layer of the display panel DP. Here, the term "directly on" means that the input sensing unit TS is on the display panel DP without using the adhesive member (e.g., the input sensing unit TS physically contacts the display panel DP).

Referring to FIG. 4B, the display module DM-1 may include a display panel DP, an input sensing unit TS, and a seventh adhesive member AD7. The display panel DP and the input sensing unit TS may be directly attached to each other by the seventh adhesive member AD7.

The first adhesive member AD1 has a first thickness WD1, the second adhesive member AD2 has a second thickness WD2, and the third adhesive member AD3 has a third thickness WD3.

Since the first to third adhesive members AD1 to AD3 perform a buffer function to absorb the impact applied thereto from the outside, the display module DM may be easily damaged due to the external impact when the first to third thicknesses WD1 to WD3 are too thin. As another example, in a case that the first to third thicknesses WD1 to WD3 are too thick or a difference between the first to third thicknesses WD1 to WD3 is large, components attached to each other by the first to third adhesive members AD1 to AD3 may become separated from each other when the display device DD is folded or curved. Thus, according to embodiments of the disclosure, the first to third thicknesses WD1 to WD3 of the first to third adhesive members AD1 to AD3 are in the respective ranges disclosed herein.

As an example, a sum of the first to third thicknesses WD1 to WD3 may be within a range equal to or greater than about 135 micrometers (μm) and equal to or less than (e.g., smaller than) about 200 micrometers (μm). In a case that the sum of the first to third thicknesses WD1 to WD3 is less than (e.g., smaller than) about 135 micrometers (μm), the display module DM may be damaged when the external impact is applied to the display module DM in a pen drop experiment. Here, the term "pen drop experiment," as used herein, refers an experiment measuring whether the display module DM of the display device DD is damaged after dropping an object with a pen shape on the display device DD at a set (e.g., predetermined) height.

In a case that the sum of the first to third thicknesses WD1 to WD3 is greater than about 200 micrometers (μm), the functional layers FC1 to FC3 may become separated from the display module DM when the display device DD is folded or curved. In addition, the thickness deviation between the thickest adhesive member among the first to third adhesive members AD1 to AD3 and the thinnest adhesive member among the first to third adhesive members AD1 to AD3 is required to be within about 30%. In a case that the thickness deviation is greater than about 30%, at least some of the functional layers FC1 to FC3 may become separated from the display module DM when the display device DD is folded or curved.

TABLE 1

| Structure | 1 | 2 | 3 | 4 |
|---|---|---|---|---|
| Number of adhesive members | Three | | | |
| WD3 | 75 μm | 50 μm | 50 μm | 50 μm |
| WD2 | 50 μm | 75 μm | 50 μm | 75 μm |
| WD1 | 50 μm | 50 μm | 75 μm | 75 μm |
| Total thickness | 175 μm | 175 μm | 175 μm | 200 μm |
| Max/Min | 1.5 | 1.5 | 1.5 | 1.5 |
| Pen drop experiment | OK | OK | OK | OK |
| Whether separation is prevented | Fail | Fail | Fail | Fail |

Table 1 shows experimental examples of structures 1 to 4. Referring to Table 1, since the sum of the first to third thicknesses WD1 to WD3 was within a range from about 175 micrometers (μm) to about 200 micrometers (μm), the display module DM was not damaged in the pen drop experiment. In addition, since the thickness deviation between the thickest adhesive member and the thinnest adhesive member among the first to third adhesive members AD1 to AD3 was about 50%, the functional layers FC1 to FC3 were not prevented from becoming separated from the display module DM when the display device DD was folded or curved.

TABLE 2

| Structure | 5 | 6 | 7 | 8 | 9 | 10 |
|---|---|---|---|---|---|---|
| Number of adhesive members | Three | | | | | |
| WD3 | 40 μm | 50 μm | 60 μm | 65 μm | 50 μm | 50 μm |
| WD2 | 40 μm | 50 μm | 60 μm | 65 μm | 60 μm | 60 μm |
| WD1 | 40 μm | 50 μm | 60 μm | 65 μm | 50 μm | 60 μm |
| Total thickness | 120 μm | 150 μm | 180 μm | 195 μm | 160 μm | 170 μm |
| Max/Min | 1 | 1 | 1 | 1 | 1.2 | 1.2 |
| Pen drop experiment | Fail | OK | OK | OK | OK | OK |

TABLE 2-continued

| Structure | 5 | 6 | 7 | 8 | 9 | 10 |
|---|---|---|---|---|---|---|
| Whether separation is prevented | OK | OK | OK | OK | OK | OK |

Table 2 shows experimental examples of structures 5 to 10. According to the experimental example of structure 5, the sum of the first to third thicknesses WD1 to WD3 was about 120 micrometers (μm), and thus the display module DM was damaged in the pen drop experiment. However, in the case that the sum of the first to third thicknesses WD1 to WD3 was about 150 micrometers (μm), the display module DM was not damaged in the pen drop experiment. When considering that an error range, which occurs during a fabricating process of the display device DD, of the first to third thicknesses WD1 to WD3 is about 10%, the sum of the first to third thicknesses WD1 to WD3 may be equal to or greater than about 135 micrometers (μm) that is about 10% less than (e.g., smaller than) 150 micrometers (μm). Referring to Table 2, since the thickness deviation between the thickest adhesive member and the thinnest adhesive member among the first to third adhesive members AD1 to AD3 was about 25% or less, the functional layers FC1 to FC3 were prevented from becoming separated from the display module DM when the display device DD was folded or curved.

In an exemplary embodiment of the present disclosure, the thinnest adhesive member among the first to third adhesive members AD1 to AD3 may be above the thickest adhesive member among the first to third adhesive members AD1 to AD3. In this case, the functional layers FC1 to FC3 may be prevented from becoming separated from the display module DM when the display device DD was folded or curved.

Figure 5:
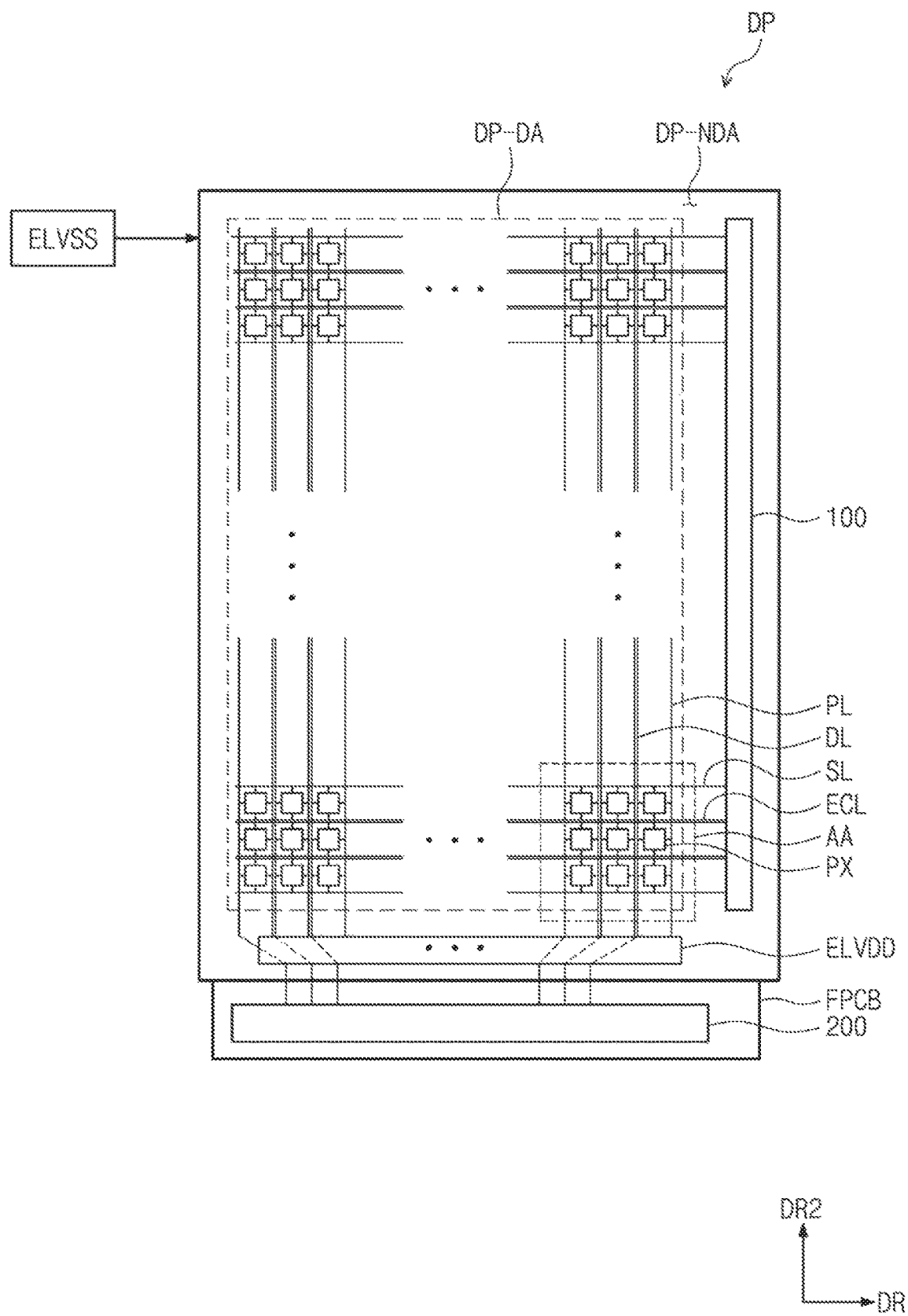
FIG. 5 is a block diagram showing a display panel according to an exemplary embodiment of the present disclosure.

FIG. 5 is a block diagram showing a display panel DP according to an exemplary embodiment of the present disclosure.

Referring to FIG. 5, the display panel DP may include a display area DP-DA and a non-display area DP-NDA. In the present exemplary embodiment, the non-display area DP-NDA may be defined along an edge of the display area DP-DA. The display area DP-DA and the non-display area DP-NDA of the display panel DP may respectively correspond to the display area DD-DA and the non-display area DD-NDA of the display device DD.

The display panel DP includes a scan driver 100, a data driver 200, a plurality of scan lines SL, a plurality of light emitting control lines ECL, a plurality of data lines DL, a plurality of power lines PL, and a plurality of pixels PX. The pixels PX are arranged in the display area DP-DA. Each of the pixels PX includes an organic light emitting diode OLED (refer to FIG. 6) and a pixel circuit CC (refer to FIG. 6) coupled to (e.g., connected to) the organic light emitting diode OLED.

The scan driver 100 includes a scan driving unit and a light emitting control driving unit.

The scan driving unit generates scan signals and sequentially applies the generated scan signals to the scan lines SL. The light emitting control driving unit generates light emitting control signals and outputs the generated light emitting control signals to the light emitting control lines ECL.

According to another embodiment of the present disclosure, the scan driver and the light emitting control driver may be provided in one circuit in the scan driver 100 without being distinguished from each other.

The scan driver 100 may include a plurality of thin film transistors formed through the same process, e.g., a low temperature polycrystalline silicon (LTPS) process or a low temperature polycrystalline oxide (LTPO) process, as a driving circuit of the pixels PX.

The data driver 200 applies data signals to the data lines DL. The data signals are analog voltages corresponding to grayscale values of image data.

In an exemplary embodiment of the present disclosure, the data driver 200 is mounted on a printed circuit board FPCB, and the printed circuit board FPCB is coupled to (e.g., connected to) pads at one ends of the data lines DL. However, according to another embodiment, the data driver 200 may be directly mounted on the display panel DP.

The scan lines SL extend in the second direction DR2 and are arranged in the first direction DR1 crossing the second direction DR2. In an exemplary embodiment of the present disclosure, the second direction DR2 is substantially perpendicular to the first direction DR1, but it should not be limited thereto or thereby.

The light emitting control lines ECL extend in the second direction DR2 and are arranged in the first direction DR1. For example, in some embodiments, each of the light emitting control lines ECL is arranged parallel (e.g., substantially parallel) to a corresponding scan line among the scan lines SL.

The data lines DL extend in the first direction DR1 and are arranged in the second direction DR2 crossing the first direction DR1. The data lines DL apply the data signals to corresponding pixels PX.

The power lines PL extend in the first direction DR1 and are arranged in the second direction DR2. The power lines PL apply a first power voltage ELVDD to corresponding pixels PX.

Each of the pixels PX is coupled to (e.g., connected to) a corresponding scan line among the scan lines SL, a corresponding light emitting control line among the light emitting control lines ECL, a corresponding data line among the data lines DL, and a corresponding power line among the power lines PL.

Figure 6:
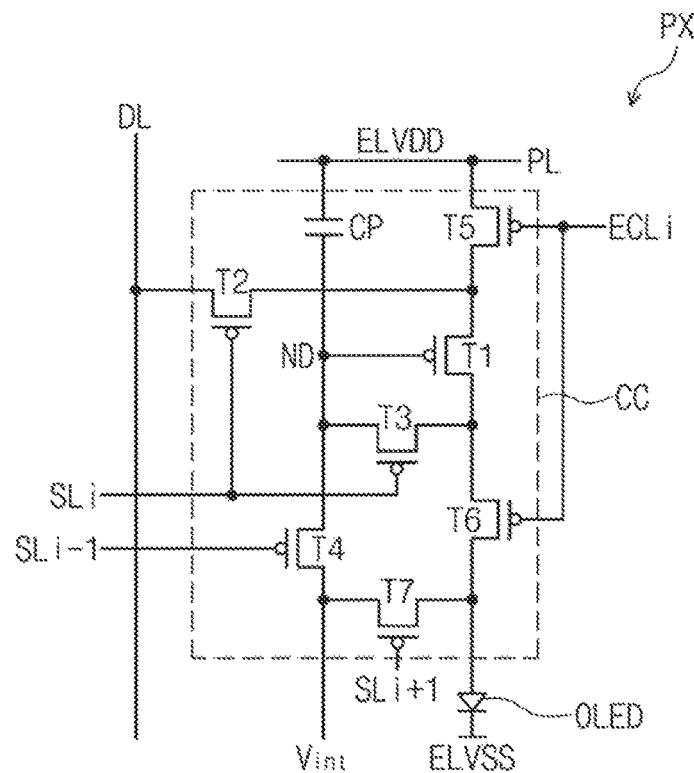
FIG. 6 is an equivalent circuit diagram showing a pixel according to an exemplary embodiment of the present disclosure.
Figure 7:
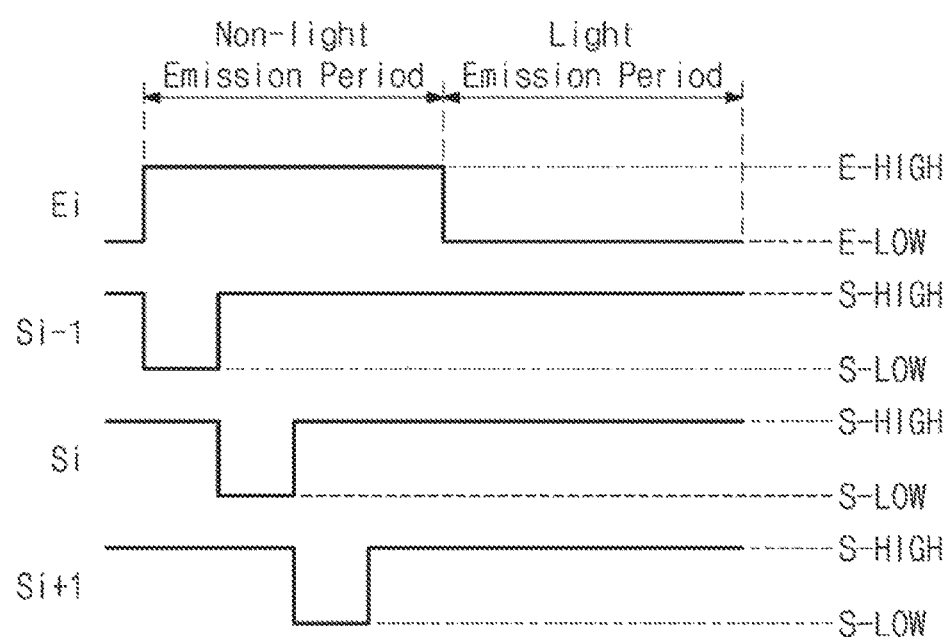
FIG. 7 is a timing diagram showing a light emitting control signal and scan signals applied to the pixel shown in FIG. 6.

FIG. 6 is an equivalent circuit diagram showing a pixel PX in area AA of FIG. 5 according to an exemplary embodiment of the present disclosure. FIG. 7 is a timing diagram showing a light emitting control signal Ei and scan signals Si−1, Si, and Si+1 applied to the pixel PX shown in FIG. 6. FIG. 6 shows the pixel PX coupled to (e.g., connected to) an i-th scan line SLi and an i-th light emitting control line ECLi as a representative example.

Referring to FIG. 6, the pixel PX includes the organic light emitting diode OLED and the pixel circuit CC. The pixel circuit CC includes a plurality of transistors T1 to T7 and a capacitor CP. The pixel circuit CC controls an amount of current flowing through the organic light emitting diode OLED in response to the data signal.

The organic light emitting diode OLED emits a light at a set (e.g., predetermined) brightness in response to the current provided from the pixel circuit CC. To this end, a level of the first power voltage ELVDD is set higher than a level of a second power voltage ELVSS.

Each of the transistors T1 to T7 includes an input electrode (or a source electrode), an output electrode (or a drain electrode), and a control electrode (or a gate electrode). For the convenience of explanation, one electrode of the input electrode and the output electrode is referred to as "first electrode," and the other electrode of the input electrode and the output electrode is referred to as "second electrode."

The first electrode of the first transistor T1 is coupled to (e.g., connected to) the first power voltage ELVDD via the fifth transistor T5, and the second electrode of the first transistor T1 is coupled to (e.g., connected to) an anode electrode of the organic light emitting diode OLED via the sixth transistor T6. The first transistor T1 may be referred to as a "driving transistor" in the following descriptions.

The first transistor T1 controls the amount of the current flowing through the organic light emitting diode OLED in response to a voltage applied to the control electrode.

The second transistor T2 is coupled between (e.g., connected between) the data line DL and the first electrode of the first transistor T1. The control electrode of the second transistor T2 is coupled to (e.g., connected to) the i-th scan line SLi. The second transistor T2 is turned on when an i-th scan signal Si is applied to the i-th scan line SLi to electrically couple (e.g., electrically connect) the data line DL to the first electrode of the first transistor T1.

The third transistor T3 is coupled between (e.g., connected between) the second electrode and the control electrode of the first transistor T1. The control electrode of the third transistor T3 is coupled to (e.g., connected to) the i-th scan line SLi. The third transistor T3 is turned on when the i-th scan signal Si is applied to the i-th scan line SLi to electrically couple (e.g., electrically connect) the second electrode and the control electrode of the first transistor T1. Accordingly, when the third transistor T3 is turned on, the first transistor T1 is coupled in (e.g., connected in) a diode configuration.

The fourth transistor T4 is coupled to (e.g., connected to) a node ND and an initialization voltage generator. The control electrode of the fourth transistor T4 is coupled to (e.g., connected to) an (i−1)th scan line SLi−1. The fourth transistor T4 is turned on when an (i−1)th scan signal Si−1 is applied to the (i−1)th scan line SLi−1 to apply an initialization voltage Vint to the node ND.

The fifth transistor T5 is coupled between (e.g., connected between) the power line PL and the first electrode of the first transistor T1. The control electrode of the fifth transistor T5 is coupled to (e.g., connected to) the i-th light emitting control line ECLi.

The sixth transistor T6 is coupled between (e.g., connected between) the second electrode of the first transistor T1 and the anode electrode of the organic light emitting diode OLED. The control electrode of the sixth transistor T6 is coupled to (e.g., connected to) the i-th light emitting control line ECLi.

The seventh transistor T7 is coupled between (e.g., connected between) the initialization voltage generator and the anode electrode of the organic light emitting diode OLED. The control electrode of the seventh transistor T7 is coupled to (e.g., connected to) an (i+1)th scan line SLi+1. The seventh transistor T7 is turned on when an (i+1)th scan signal Si+1 is applied to the (i+1)th scan line SLi+1 to apply the initialization voltage Vint to the anode electrode of the organic light emitting diode OLED.

The seventh transistor T7 improves a black display performance of the pixel PX. In more detail, when the seventh transistor T7 is turned on, a parasitic capacitor of the organic light emitting diode OLED is discharged. Accordingly, when a black brightness is implemented, the organic light emitting diode OLED does not emit light even though a leakage current from the first transistor T1 occurs, and thus the black display performance of the pixel PX is improved.

In FIG. 6, the control electrode of the seventh transistor T7 is coupled to (e.g., connected to) the (i+1)th scan line SLi+1, but it should be clear that the present disclosure is not limited to such embodiments. According to another embodiment of the present disclosure, the control electrode of the seventh transistor T7 is coupled to (e.g., connected to) the i-th scan line SLi or the (i−1)th scan line SLi−1.

In FIG. 6, the first to seventh transistors T1 to T7 of the pixel PX have been described based on a PMOS, but they should not be limited thereto or thereby. According to another embodiment of the present disclosure, the first to seventh transistors T1 to T7 of the pixel PX may be implemented by an NMOS. According to another embodiment of the present disclosure, the first to seventh transistors T1 to T7 of the pixel PX may be implemented by a combination of the PMOS and the NMOS.

The capacitor CP is between the power line PL and the node ND. The capacitor CP is charged with a voltage corresponding to the data signal. When the fifth and sixth transistors T5 and T6 are turned on, the amount of current flowing through the first transistor T1 is determined depending on the voltage charged in the capacitor CP.

In the present disclosure, the configuration of the pixel PX should not be limited to the configuration shown in FIG. 6. According to another embodiment of the present disclosure, the pixel PX may be implemented in various suitable ways to allow the organic light emitting diode OLED to emit light.

Referring to FIG. 7, the light emitting control signal Ei has a high level E-HIGH or a low level E-LOW. Each of the scan signals SLi−1, SLi, and SLi+1 has a high level S-HIGH or a low level S-LOW.

When the light emitting control signal Ei has the high level E-HIGH, the fifth and sixth transistors T5 and T6 are turned off. When the fifth transistor T5 is turned off, the power line PL and the first electrode of the first transistor T1 are electrically blocked from each other. When the sixth transistor T6 is turned off, the second electrode of the first transistor T1 and the anode electrode of the organic light emitting diode OLED are electrically blocked from each other. Accordingly, the organic light emitting diode OLED does not emit light during a period in which the light emitting control signal Ei having the high level E-HIGH is applied to the i-th light emitting control line ECLi.

Then, when the (i−1)th scan signal Si−1 applied to the (i−1)th scan line SLi−1 has the low level S-LOW, the fourth transistor T4 is turned on. When the fourth transistor T4 is turned on, the initialization voltage Vint is applied to the node ND.

When the i-th scan signal Si applied to the i-th scan line SLi has the low level S-LOW, the second and third transistors T2 and T3 are turned on.

When the second transistor T2 is turned on, the data signal is applied to the first electrode of the first transistor T1. In this case, since the node ND is initialized to have the initialization voltage Vint, the first transistor T1 is turned on. When the first transistor T1 is turned on, the voltage corresponding to the data signal is applied to the node ND. In this case, the capacitor CP is charged with the voltage corresponding to the data signal.

When the (i+1)th scan signal Si+1 applied to the (i+1)th scan line SLi+1 has the low level S-LOW, the seventh transistor T7 is turned on.

When the seventh transistor T7 is turned on, the initialization voltage Vint is applied to the anode electrode of the organic light emitting diode OLED, and thus the parasitic capacitor of the organic light emitting diode OLED is discharged.

When the light emitting control signal Ei applied to the light emitting control line ECLi has the low level E-LOW, the fifth and sixth transistors T5 and T6 are turned on. When the fifth transistor T5 is turned on, the first power voltage ELVDD is applied to the first electrode of the first transistor T1. When the sixth transistor T6 is turned on, the second electrode of the first transistor T1 and the anode electrode of the organic light emitting diode OLED are electrically coupled to (e.g., electrically connected to) each other. Accordingly, the organic light emitting diode OLED generates light with the set (e.g., predetermined) brightness in response to the amount of the current applied thereto.

Figure 8:
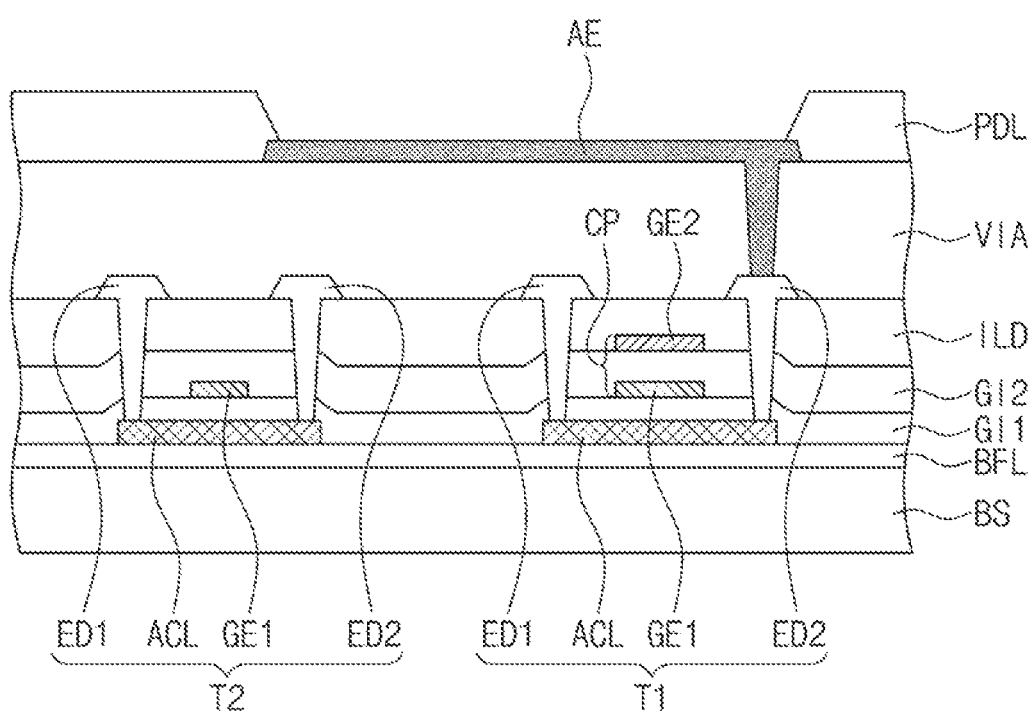
FIG. 8 is a cross-sectional view showing a portion of a pixel according to an exemplary embodiment of the present disclosure.

FIG. 8 is a cross-sectional view showing a portion of the pixel PX (refer to FIG. 6) according to an exemplary embodiment of the present disclosure. FIG. 8 shows the first and second transistors T1 and T2 as a representative example, but the structure of the first and second transistors T1 and T2 should not be limited thereto or thereby. In FIG. 8, it seems that the second electrode ED2 of the first transistor T1 directly makes contact (e.g., physical contact) with the anode electrode AE of the pixel PX, but this is because it is a cross-sectional shape. As shown in FIG. 6, the first transistor T1 is coupled to (e.g., connected to) the anode electrode AE of the pixel PX via the sixth transistor T6. However, according to another embodiment of the present disclosure, the second electrode ED2 of the first transistor T1 may directly make contact (e.g., physical contact) with the anode electrode AE of the pixel PX.

The display panel DP (refer to FIG. 5) includes a base substrate BS, a buffer layer BFL, gate insulating layers GI1 and GI2, an interlayer insulating layer ILD, a circuit insulating layer VIA, and a pixel definition layer PDL.

The buffer layer BFL is on one surface of the base substrate BS.

The buffer layer BFL prevents foreign substances in the base substrate BS from entering the pixel PX during a manufacturing process (or reduces a likelihood or amount of the foreign substances in the base substrate BS entering the pixel PX). For example, the buffer layer BFL prevents the foreign substances from entering active portions ACL of the transistors T1 and T2 of the pixel PX (or reduces a likelihood or amount of the foreign substances entering the active portions ACL of the transistors T1 and T2 of the pixel PX).

The foreign substances may inflow from the outside or may be generated when the base substrate BS is pyrolyzed. The foreign substances may be gas or sodium discharged from the base substrate BS. In addition, the buffer layer BFL blocks moisture from entering the pixel PX from the outside.

The active portions ACL of the transistors T1 and T2 are on the buffer layer BFL. Each of the active portions ACL includes polysilicon or amorphous silicon. In some embodiments, the active portions ACL may include a metal oxide semiconductor.

The active portions ACL include a channel area that serves as a passage through which electrons or holes move, a first ion doping area, and a second ion doping area located such that the channel area is between the first ion doping area and the second ion doping area.

A first gate insulating layer GI1 is above the buffer layer BFL to cover the active portions ACL. The first gate insulating layer GI1 includes an organic layer and/or an inorganic layer. The first gate insulating layer GI1 includes a plurality of inorganic thin film layers. The inorganic thin film layers include a silicon nitride layer and a silicon oxide layer.

The control electrodes GE1 of the transistors T1 and T2 are on the first gate insulating layer GI1. The control electrode GE1 of the first transistor T1 may be one of two electrodes forming the capacitor CP. At least some of the scan lines SL (refer to FIG. 5) and the light emitting control lines ECL (refer to FIG. 5) are on the first gate insulating layer GI1.

A second gate insulating layer GI2 is on the first gate insulating layer GI1 to cover the control electrodes GE1. The second gate insulating layer GI2 includes an organic layer and/or an inorganic layer. The second gate insulating layer GI2 includes a plurality of inorganic thin film layers. The inorganic thin film layers include a silicon nitride layer and a silicon oxide layer.

The other electrode of the two electrodes forming the capacitor CP (refer to FIG. 6) is on the second gate insulating layer GI2. For example, in some embodiments, the control electrode GE1 on the first gate insulating layer GI1 overlaps with the control electrode GE2 on the second gate insulating layer GI2 to form the capacitor CP shown in FIG. 6. However, positions of the electrodes forming the capacitor CP should not be limited thereto or thereby.

The interlayer insulating layer ILD is on the second gate insulating layer GI2 to cover the control electrode GE2. The interlayer insulating layer ILD includes an organic layer and/or an inorganic layer. The interlayer insulating layer ILD includes a plurality of inorganic thin film layers. The inorganic thin film layers include a silicon nitride layer and a silicon oxide layer.

At least some portions of the data line DL (refer to FIG. 5) and the power line PL (refer to FIG. 5) are on the interlayer insulating layer ILD. The first electrodes ED1 and the second electrodes ED2 of the transistors T1 and T2 are on the interlayer insulating layer ILD.

The first electrodes ED1 and the second electrodes ED2 are coupled to (e.g., connected to) corresponding active portions ACL through thru-holes defined through the gate insulating layers GI1 and GI2 and the interlayer insulating layer ILD.

The circuit insulating layer VIA is on the interlayer insulating layer ILD to cover the first electrodes ED1 and the second electrodes ED2. The circuit insulating layer VIA includes an organic layer and/or an inorganic layer. The circuit insulating layer VIA provides a flat surface.

The pixel definition layer PDL and the organic light emitting diode OLED are on the circuit insulating layer VIA. For the convenience of explanation, FIG. 8 shows only the anode electrode AE of the organic light emitting diode OLED. In some embodiments, the organic light emitting diode OLED further includes a hole transport region, a light emitting layer, an electron transport region, and a cathode electrode in addition to the anode electrode AE. In some embodiments, the display panel DP includes a thin film encapsulation layer to encapsulate the organic light emitting diode OLED.

Figure 9:
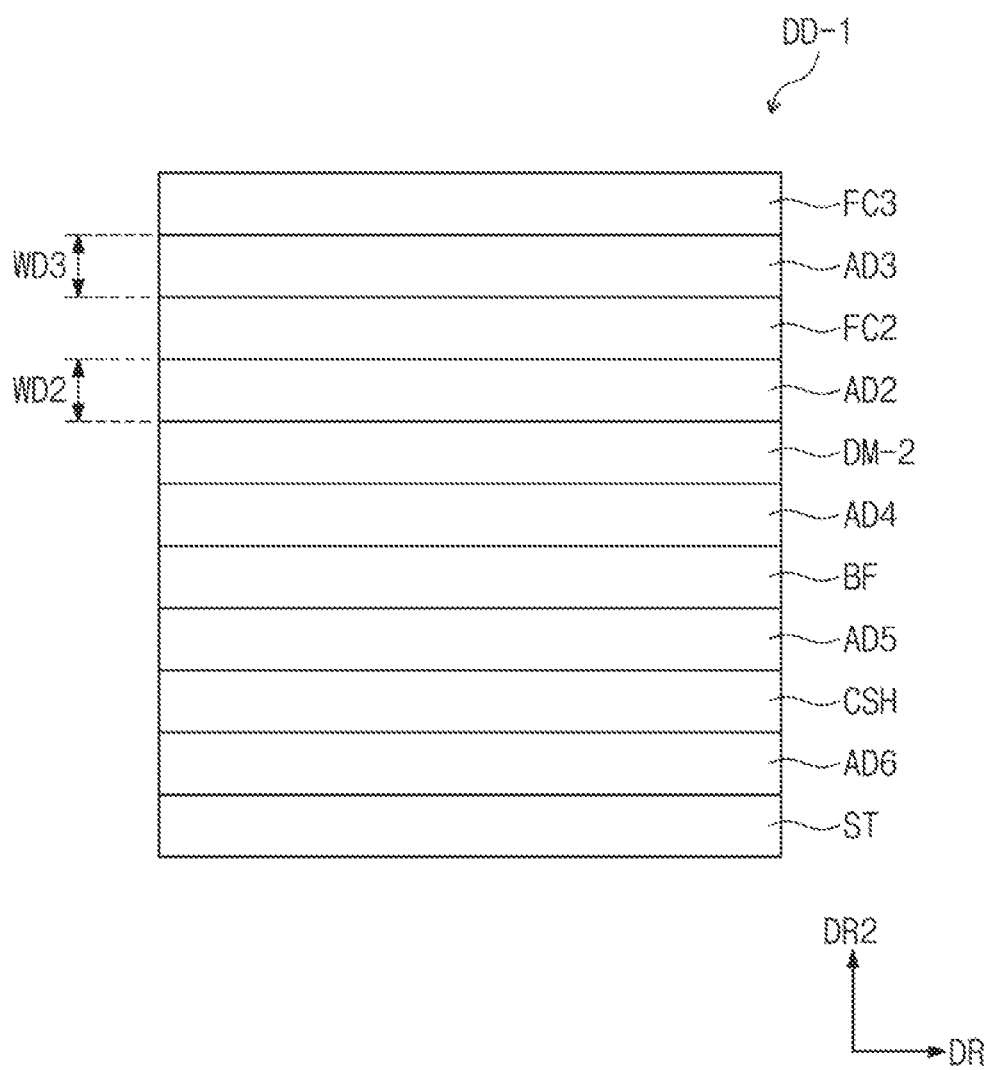
FIG. 9 is a cross-sectional view showing a display device according to an exemplary embodiment of the present disclosure.
Figure 10A:
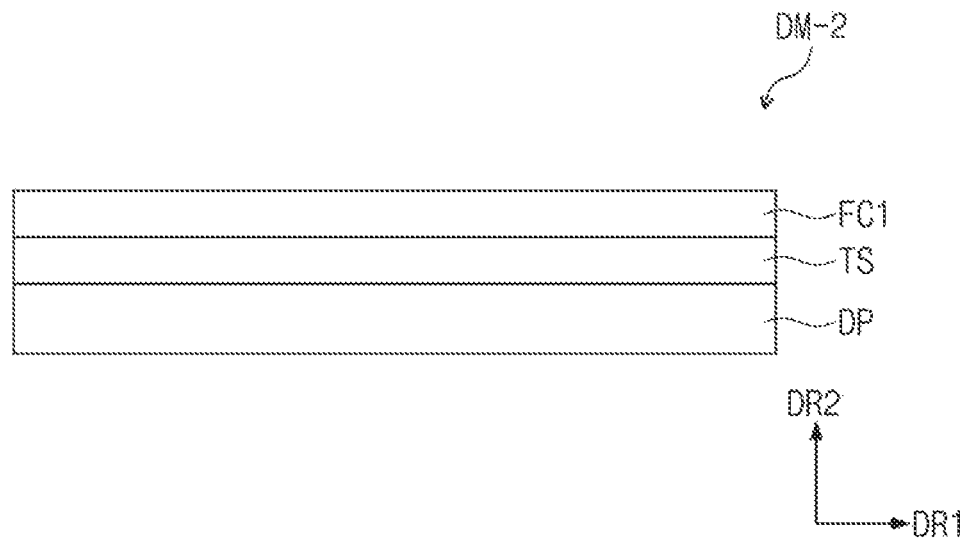
FIGS. 10A-10B are cross-sectional views showing a display module shown in FIG. 9.
Figure 10B:
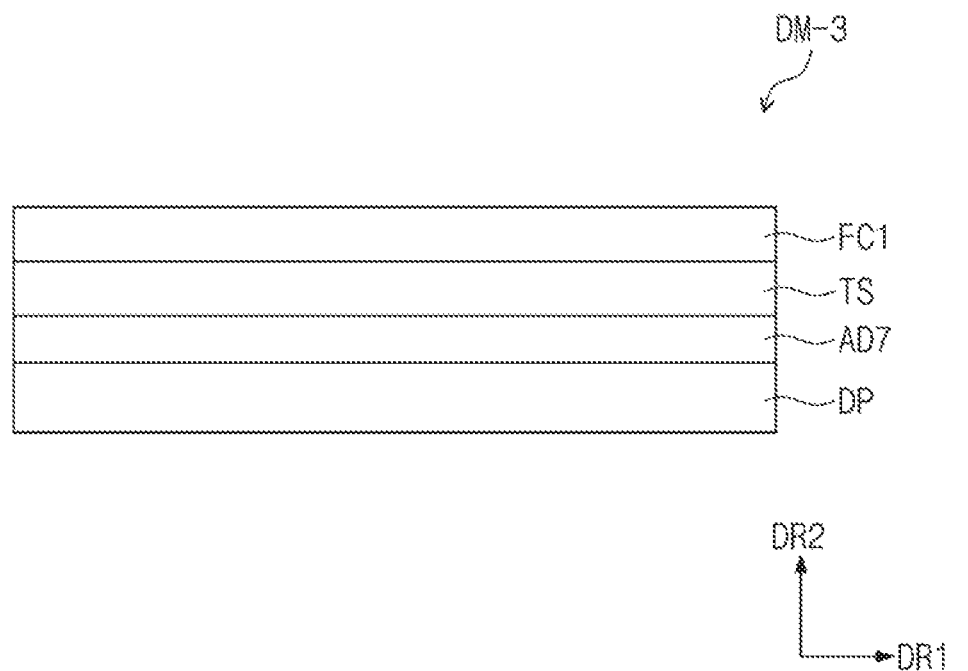

FIG. 9 is a cross-sectional view showing a display device DD-1 according to an exemplary embodiment of the present disclosure. FIGS. 10A-10B are cross-sectional views showing display modules DM-2 and DM-3 shown in FIG. 9.

The display device DD-1 includes a second display module DM-2, a plurality of functional layers FC2 and FC3, a base film BF, a cushion layer CSH, a set member ST, and a plurality of adhesive members AD2, AD3, AD4, AD5, and AD6.

When comparing with the display device DD shown in FIG. 3, the first adhesive member AD1 and the first functional layer FC1 are omitted from the display device DD-1 shown in FIG. 9. Accordingly, only two adhesive members AD2 and AD3 are above the display module DM-2.

In some embodiments, as shown in FIGS. 10A-10B, a first functional layer FC1 having a polarization function may be in the display modules DM-2 and DM-3.

In an exemplary embodiment of the present disclosure, a sum of a second thickness WD2 and a third thickness WD3 is equal to or greater than about 135 micrometers (μm) and equal to or less than (e.g., smaller than) about 200 micrometers (μm). In a case that the sum of the second thickness WD2 and the third thickness WD3 is less than (e.g., smaller than) about 135 micrometers (μm), the display module DM-2 may be damaged when the external impact is applied to the display module DM-2 during the pen drop experiment. In a case that the sum of the second thickness WD2 and the third thickness WD3 is greater than about 200 micrometers (μm), the functional layers FC2 and FC3 may become separated from the display module DM-2 when the display device DD-1 is folded or curved. In addition, a thickness deviation between the second and third adhesive members AD2 and AD3 is required to be within about 30%. In a case that the thickness deviation is greater than about 30%, the functional layers FC2 and FC3 may become separated from the display module DM-2 when the display device DD is folded or curved.

TABLE 3

| Structure | 11 | 12 | 13 | 14 | 15 |
| --- | --- | --- | --- | --- | --- |
| Number of adhesive members | | | Two | | |
| WD3 | 75 μm | 50 μm | 50 μm | 50 μm | 60 μm |
| WD2 | 50 μm | 75 μm | 60 μm | 50 μm | 60 μm |
| WD1 | — | — | — | — | — |
| Total thickness | 125 μm | 125 μm | 110 μm | 100 μm | 120 μm |
| Max/Min | 1.5 | 1.5 | 1.2 | 1 | 1 |
| Pen drop experiment | Fail | Fail | Fail | Fail | Fail |
| Whether separation is prevented | Fail | Fail | OK | OK | OK |

Table 3 shows experimental examples of structures 11 to 15. Referring to Table 3, since the sum of the second and third thicknesses WD2 and WD3 was equal to or less than (e.g., smaller than) about 125 micrometers (μm) in the structures 11 to 15, the display module DM-2 was damaged when the external impact was applied to the display module DM-2 in the pen drop experiment. In the structures 11 and 12, since the thickness deviation between the relatively thicker adhesive member of the second and third adhesive members AD2 and AD3 and the relatively thinner adhesive member of the second and third adhesive members AD2 and AD3 was about 50%, the functional layers FC2 and FC3 were not prevented from becoming separated from the display module DM-2 when the display device DD-1 was folded or curved. On the other hand, in the structures 13, 14, and 15, since the thickness deviation between the relatively thicker adhesive member of the second and third adhesive members AD2 and AD3 and the relatively thinner adhesive member of the second and third adhesive members AD2 and AD3 was less than (e.g., smaller than) about 20%, the functional layers FC2 and FC3 were prevented from becoming separated from the display module DM-2 when the display device DD-1 was folded or curved.

In an exemplary embodiment of the present disclosure, the relatively thinner adhesive member of the second and third adhesive members AD2 and AD3 may be above the relatively thicker adhesive member of the second and third adhesive members AD2 and AD3. In this case, the functional layers FC2 and FC3 may be prevented from becoming separated from the display module DM-2 when the display device DD-1 was folded or curved.

Since other components of the display device DD-1 have the same structure and function as those described with reference to FIGS. 3 and 4A-4B, redundant description thereof will not be repeated here.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present disclosure shall be determined according to the attached claims, and equivalents thereof.

What is claimed is:

1. A display device comprising:
   a flexible display panel;
   a plurality of functional layers above the flexible display panel and comprising:
      an impact-absorbing functional layer to absorb an impact applied thereto, and
      a window functional layer above the impact-absorbing functional layer; and
   a plurality of adhesive members each being between respective ones of the plurality of functional layers or between one functional layer among the plurality of functional layers and the flexible display panel,
   wherein a sum of thicknesses of the plurality of adhesive members is equal to or greater than 150 micrometers (μm) and equal to or less than 195 micrometers (μm), and a thickness of an adhesive member of the plurality of adhesive members having the largest thickness among the plurality of adhesive members is equal to or less than about 1.3 times a thickness of an adhesive member of the plurality of adhesive members having the smallest thickness among the plurality of adhesive members,
   wherein the plurality of functional layers further comprise a polarizing functional layer to polarize a light incident thereto, and the polarizing functional layer is between the impact-absorbing functional layer and the flexible display panel,
   wherein the plurality of adhesive members comprise a first adhesive member between the flexible display panel and the polarizing functional layer, a second adhesive member between the polarizing functional layer and the impact-absorbing functional layer, and a third adhesive member between the impact-absorbing functional layer and the window functional layer, and
   wherein each of the first, second, and third adhesive members has a thickness that is equal to or greater than 50 micrometers (μm) and equal to or less than 65 micrometers (μm).

2. The display device of claim 1, wherein the adhesive member having the smallest thickness is above the adhesive member having the largest thickness.

3. The display device of claim 1, wherein each of the plurality of functional layers has a modulus equal to or greater than 2 GPa and equal to or less than 100 GPa.

4. The display device of claim 3, wherein the plurality of functional layers further comprise a protection functional layer on the window functional layer.

5. The display device of claim 1, further comprising a cushion layer under the flexible display panel to absorb an impact applied thereto.

6. The display device of claim 5, further comprising a set member under the cushion layer to support the flexible display panel.

7. The display device of claim 1, wherein each of the plurality of functional layers has a thickness equal to or greater than 35 micrometers (μm) and equal to or less than 60 micrometers (μm).

8. The display device of claim 1, wherein the third adhesive member between the impact-absorbing functional layer and the window functional layer of the plurality of adhesive members directly contacts the impact-absorbing functional layer.

9. The display device of claim 1, wherein the impact-absorbing functional layer has a modulus equal to or greater than 2 GPa and equal to or less than 35 GPa.

10. The display device of claim 1,
    wherein a thickness of the polarizing functional layer is equal to or greater than 35 micrometers (μm) and less than or equal to 60 micrometers (μm).

11. The display device of claim 1, further comprising an input sensing member directly on the flexible display panel.

12. The display device of claim 1, wherein the thickness of the adhesive member of the plurality of adhesive members having the largest thickness among the plurality of adhesive members is equal to or less than about 1.2 times the thickness of the adhesive member of the plurality of adhesive members having the smallest thickness among the plurality of adhesive members.

13. The display device of claim 1, wherein the window functional layer and the impact-absorbing functional layer each have a thickness of about 35 micrometers (μm) to about 60 micrometers (μm).

* * * * *